(12) United States Patent
Bode et al.

(10) Patent No.: US 6,589,875 B1
(45) Date of Patent: Jul. 8, 2003

(54) METHOD OF SELECTIVELY PROCESSING WAFER EDGE REGIONS TO INCREASE WAFER UNIFORMITY, AND SYSTEM FOR ACCOMPLISHING SAME

(75) Inventors: Christopher A. Bode, Austin, TX (US); Alexander J. Pasadyn, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 09/920,997

(22) Filed: Aug. 2, 2001

(51) Int. Cl.[7] ............................................. H01L 21/311
(52) U.S. Cl. ..................... 438/697; 438/734; 438/942; 438/947; 438/974
(58) Field of Search ........................ 438/689, 694–697, 438/706, 709, 717, 734–736, 942, 947, 974, 977, 459, 631, 935

(56) References Cited

U.S. PATENT DOCUMENTS

| | | | | |
|---|---|---|---|---|
| 4,539,744 A | * | 9/1985 | Burton | 438/443 |
| 4,705,596 A | * | 11/1987 | Gimpelson et al. | 438/697 |
| 4,774,416 A | * | 9/1988 | Askary et al. | 250/492.2 |
| 5,212,116 A | * | 5/1993 | Yu | 216/66 |
| 5,387,312 A | * | 2/1995 | Keller et al. | 438/714 |

* cited by examiner

Primary Examiner—Khanh Duong
(74) Attorney, Agent, or Firm—Williams, Morgan & Amerson, P.C.

(57) ABSTRACT

In one illustrative embodiment, the method includes providing a wafer including at least one non-production area, forming a process layer above the wafer, forming a masking layer above the process layer, the masking layer being patterned so as to expose a portion of the process layer formed above the at least one non-production area, and performing a process operation on the exposed portion of the process layer formed above the at least one non-production area. In another aspect, the present invention is directed to a system that includes a controller for identifying at least one non-production area of a wafer, a photolithography tool for forming a masking layer above the process layer, the masking layer being patterned so as to expose a portion of the process layer formed above the at least one non-production area, and an etch tool for performing an etching process on the exposed portion of the process layer formed above the at least one non-production area.

24 Claims, 5 Drawing Sheets

METHOD OF SELECTIVELY PROCESSING WAFER EDGE REGIONS TO INCREASE WAFER UNIFORMITY, AND SYSTEM FOR ACCOMPLISHING SAME

BACKGROUND OF THE INVENTION

1. Field of the Invention

This invention relates generally to semiconductor fabrication technology, and, more particularly, to a method of selectively processing wafer edge regions to increase wafer uniformity, and a system for accomplishing same.

2. Description of the Related Art

In the process of forming integrated circuit devices, millions of transistors, such as the illustrative transistor 10 depicted in FIG. 1, are formed above a semiconducting wafer. By way of background, an illustrative field effect transistor 10, as shown in FIG. 1, may be formed above a surface 15 of a semiconducting wafer 11 comprised of doped-silicon. The wafer 11 may be doped with either N-type or P-type dopant materials. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the wafer 11. Shallow trench isolation regions 18 may be provided to isolate the transistor 10 electrically from neighboring semiconductor devices, such as other transistors (not shown).

In general, semiconductor manufacturing operations involve, among other things, the formation of layers of various materials, e.g., polysilicon, insulating materials, etc., and the selective removal of portions of those layers by performing known photolithographic and etching techniques. These processes, along with various ion implant and heating processes, are continued until such time as the integrated circuit device is complete. Additionally, although not depicted in FIG. 1, a typical integrated circuit device is comprised of a plurality of conductive interconnections, such as conductive lines and conductive contacts or vias, positioned in multiple layers of insulating material formed above the wafer. These conductive interconnections allow electrical signals to propagate between the transistors formed above the wafer.

As shown in FIG. 2, a plurality of die 26 are typically formed above the wafer 11. The die 26 define the area of the wafer 11 where production integrated circuit devices, e.g., microprocessors, ASICs, memory devices, will be formed. The size, shape and number of die 26 per wafer 11 depend upon the type of device under construction. For example, several hundred die 26 may be formed above an 8-inch diameter wafer 11. The wafer 11 may also have an alignment notch 17 that is used to provide relatively rough alignment of the wafer 11 prior to performing certain processes, e.g., an alignment process prior to performing an exposure process in a stepper tool.

During the course of manufacturing integrated circuit devices, the thickness of a process layer (not shown) formed above the wafer 11 may vary across the surface of the wafer. That is, the process layer may exhibit a center-to-edge profile in which the layer is thicker at the edge of the wafer than at the center of the wafer, or vice versa. Such across-wafer thickness variations may be caused by, or be the result of, various manufacturing operations. For example, many process layers, e.g., inter-level dielectric layers, are subjected to one or more chemical mechanical polishing (CMP) processes in an attempt to produce an approximately planar upper surface on the layer. Unfortunately, due to a variety of reasons, the chemical mechanical polishing process may result in the process layer being thicker toward the edge of the wafer 11 than at the approximate center of the wafer 11. That is, the surface topography of the process layer after the chemical mechanical polishing process is performed may be somewhat concave. Chemical mechanical polishing processes that result in process layers having such concave surface topography are sometimes referred to as center-fast or edge-slow polishing processes due to the extra thickness of the process layer toward the edge of the wafer 11.

Deposition processes may also produce process layers that exhibit similar thickness variations across the center of a wafer. For example, deposition processes, such as chemical vapor deposition (CVD), plasma enhanced chemical vapor deposition (PECVD), physical vapor deposition (PVD), etc., may produce process layers that are thicker at the edge of the wafer than at the center of the wafer. Such variations may be caused by a variety of factors, e.g., cleanliness of the deposition tool, process gas composition, temperature variation within the deposition tool, etc.

Unfortunately, such thickness variations may be problematic with respect to subsequent manufacturing operations to be performed after the process layer is formed. For example, if a process layer, as deposited, is thicker at the edge of the wafer 11 than at the center of the wafer 11, a subsequent chemical mechanical polishing process may have to be varied in an effort to reduce the excess thickness of the layer near the edge of the wafer 11. That is, the chemical mechanical polishing process may be varied such that it removes more material near the edge region of the wafer than at the center of the wafer. Such a polishing process is sometimes referred to as an edge-fast or center-slow polishing process. This compensating chemical mechanical polishing process is performed until such time as the excess thickness of the process layer is removed.

However, in modern semiconductor manufacturing, most, if not all, wafers have non-production areas, i.e., areas where production die cannot be formed due to a variety of reasons, e.g., unavailability of plot space. Unfortunately, the portions of the process layer formed above these non-production areas are subject to the same type of processing performed on the portions of the process layer formed above production areas of the wafer 11, e.g., the plurality of die 26. Accordingly, such compensatory processes may be longer in duration than necessary as a result of removing the excess thickness of the portions of the process layer formed above the non-production areas.

The present invention is directed to a method and system that may solve, or at least reduce, some or all of the aforementioned problems.

SUMMARY OF THE INVENTION

In general, the present invention is directed to a method of selectively processing wafer edge regions to increase wafer uniformity, and a system for accomplishing same. In one illustrative embodiment, the method disclosed herein comprises providing a wafer comprised of at least one non-production area, forming a process layer above the wafer, forming a masking layer above the process layer, the masking layer being patterned so as to expose a portion of the process layer formed above the at least one non-production area, and performing a process operation on the exposed portion of the process layer formed above the at least one non-production area.

In another aspect, the present invention is directed to a system that comprises a controller for identifying at least one non-production area of a wafer, a photolithography tool for forming a masking layer above the process layer, the masking layer being patterned so as to expose a portion of the process layer formed above the at least one non-production area, and an etch tool for performing an etching process on the exposed portion of the process layer formed above the at least one non-production area.

BRIEF DESCRIPTION OF THE DRAWINGS

The invention may be understood by reference to the following description taken in conjunction with the accompanying drawings, in which like reference numerals identify like elements, and in which.

Figure 1:
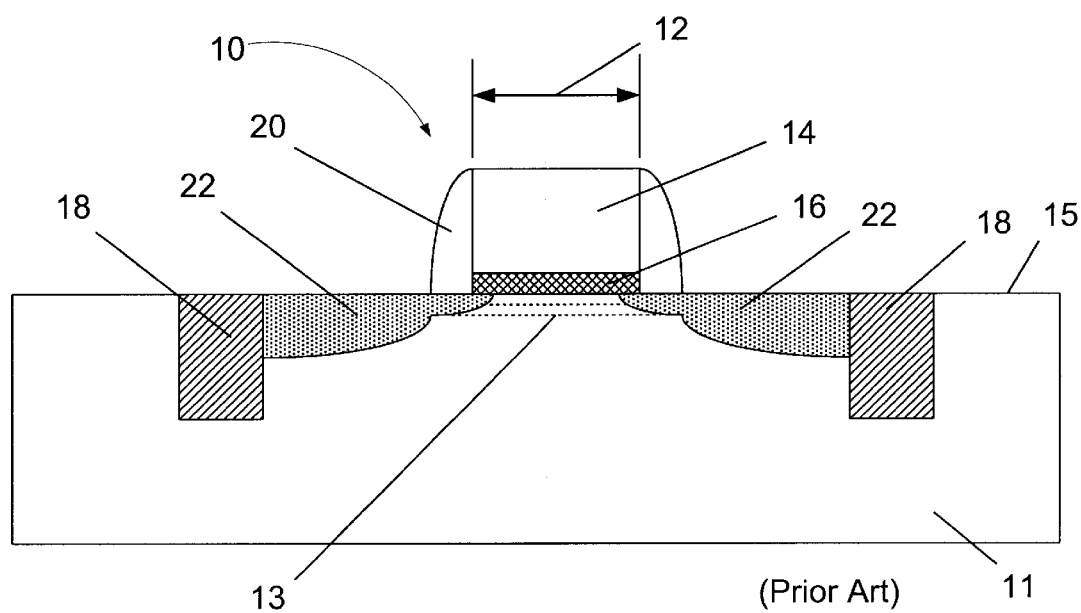
FIG. 1 is a cross-sectional view of an illustrative prior art transistor.
Figure 2:
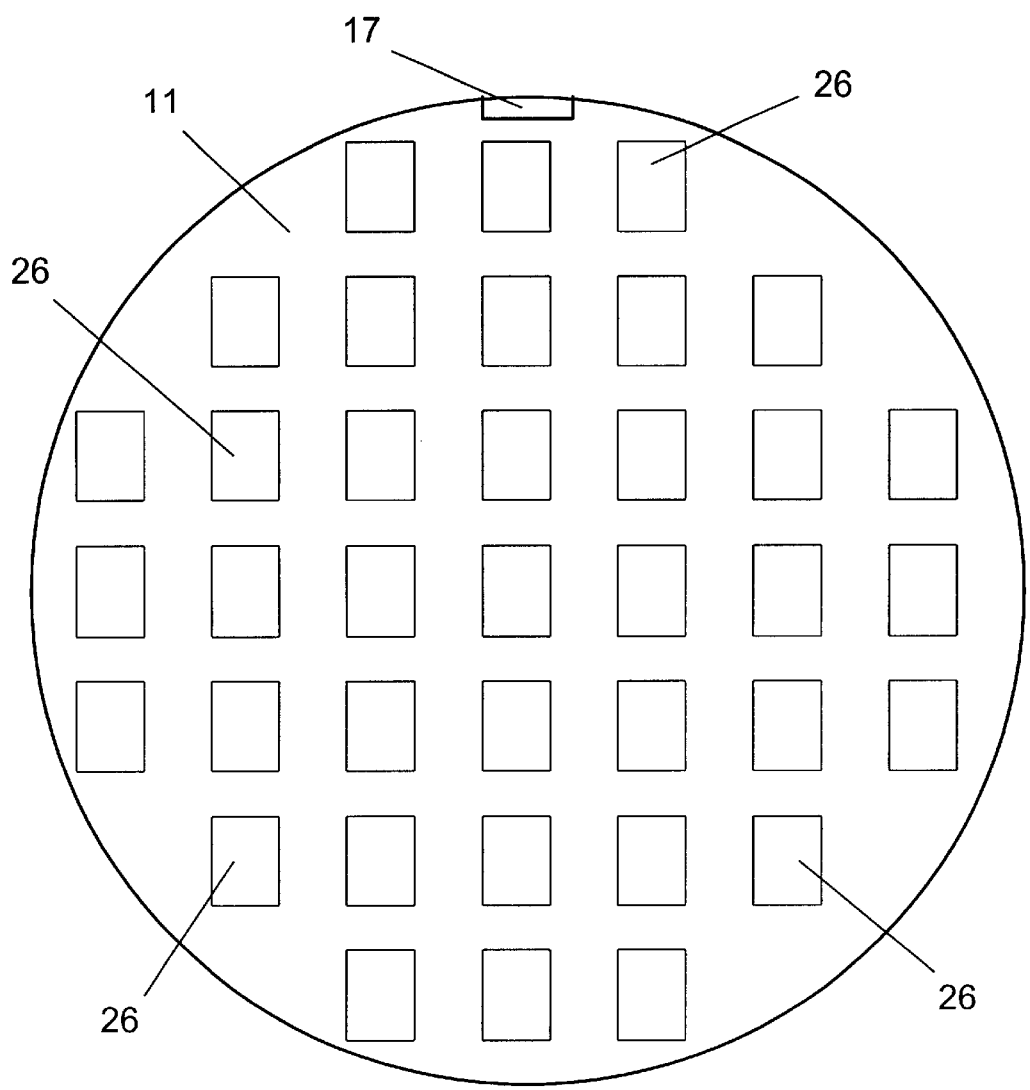
FIG. 2 is a plan view of an illustrative prior art wafer having a plurality of die formed thereabove.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Moreover, the components of the illustrative system do not depict all of the supporting structures and devices that are part of such real-word components. Nevertheless, the attached drawings are included to describe and explain illustrative examples of the present invention.

In general, the present invention is directed to a method of selectively processing wafer edge regions to increase wafer uniformity, and a system for accomplishing same. As will be readily apparent to those skilled in the art upon a complete reading of the present application, the present method is applicable to a variety of technologies, e.g., NMOS, PMOS, CMOS, etc., and it is readily applicable to a variety of devices, including, but not limited to, logic devices, memory devices, etc.

Figure 3:
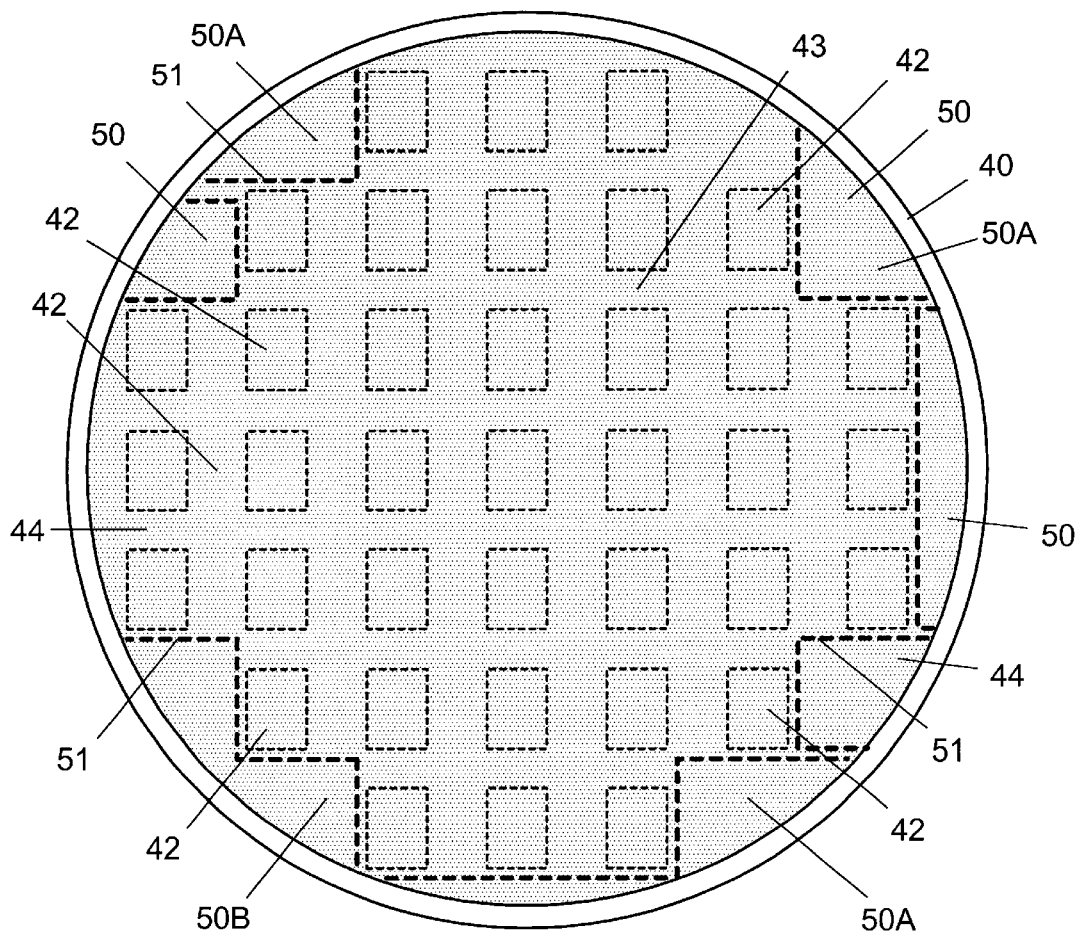
FIG. 3 is a plan view of an illustrative wafer having a process layer formed thereabove.
Figure 4:
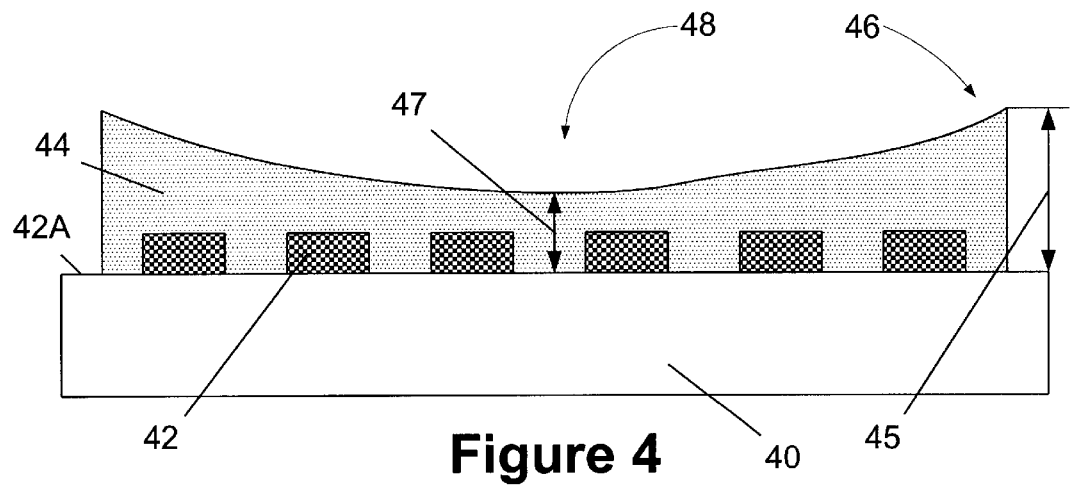
FIG. 4 is a cross-sectional view of the wafer depicted in FIG. 3.

The present invention will now be initially described with reference to FIGS. 3 and 4. As shown therein, a wafer 40 has a plurality of production die 42 and a process layer 44 formed thereabove. As stated previously in the background section of this application, the production die 42 are areas of the wafer 40 where production integrated circuit devices, e.g., microprocessors, ASICs, memory devices, etc., may be formed. Moreover, the size and number of die 42 may vary depending upon the devices under construction and the size of the wafer 40. Also, note that the spacing between the production die 42 in FIG. 3 is somewhat exaggerated for purposes of clarity. The spacing between the die 42 is generally referred to as a scribe line 43. Ultimately, the wafer 40 will be cut along the scribe lines 43 and the die 42 will be packaged and sold.

In one embodiment, the thickness of the process layer 44 varies across the surface 42A of the wafer 40. That is, in the depicted embodiment, the process layer 44 has a thickness 45 near an edge region 46 of the wafer 40 that is greater than the thickness 47 of the process layer 44 near a center region 48 of the wafer 40. It should be understood that the thickness variations of the process layer 44 depicted in FIG. 4 are exaggerated for purposes of explanation. In real-world applications, the process layer 44 is very thin, and the thickness variations are even smaller, but nevertheless important given the precision required in manufacturing integrated circuit devices. For example, in the situation where the process layer 44 is comprised of an insulating material, e.g., silicon dioxide, for use as an inter-level dielectric layer, the process layer 44 may have a nominal or target thickness of approximately 1.5–2.0 μm (15,000–20,000 Å) and its thickness may vary across the surface of the wafer by an amount of approximately 0.05 μm (500 Å).

The thickness variations in the process layer 44 may be caused by a variety of factors. For example, the thickness variation may be the result of performing an unintentional edge-slow chemical mechanical polishing process on the process layer 44 after it is formed. Alternatively, the thickness variation of the process layer 44 may be the result of a deposition process that unintentionally forms the process layer 44 thicker near the edge region 48 of the wafer 40. In one embodiment, the present invention may be employed with any process layer exhibiting across-wafer variations in thickness, irrespective of the cause of such variations or whether such variations are intentional or unintentional. Of course, as will be recognized by those skilled in the art after a complete reading of the present application, the present invention may be employed on a process layer in general irrespective of its thickness variations, or lack thereof.

The process layer 44 is intended to be illustrative of any type of process layer that may be formed in semiconductor manufacturing operations, and it may be comprised of a variety of materials. For example, the process layer 44 may be comprised of polysilicon, a metal, silicon dioxide, silicon oxynitride, silicon nitride, etc. The process layer 44 may be formed for a variety of reasons. For example, the process layer 44 may be comprised of polysilicon and it may be formed as part of a process of forming gate electrode structures (not shown) above the wafer 40. Alternatively, the process layer 44 may be a layer of insulating material, e.g., silicon dioxide, formed as an inter-level dielectric layer in which a plurality of conductive interconnections, e.g, conductive lines and/or plugs, will be formed.

Also depicted in FIG. 3 is a plurality of non-production areas 50. Some, but not all, of the non-production areas 50 are indicated by dashed lines 51. The non-production areas 50 are areas of the wafer 40 where production die 42, i.e., die that are intended to produce useful integrated circuit products, are not formed. The non-production areas 50 also do not include the scribe line 43 on the wafer 40. The size, shape and location of the non-production areas 50 may vary depending on a variety of factors, such as the number of die 42 formed on the wafer 40 and the size of such die 42. For example, in the depicted embodiment, the non-production areas 50A have a pie-shaped configuration, whereas the non-production area 50B has an irregular configuration. Thus, the size and/or configuration of the non-production areas 50 should not be considered a limitation of the present invention unless such limitations are clearly set forth in the appended claims.

Figure 5:
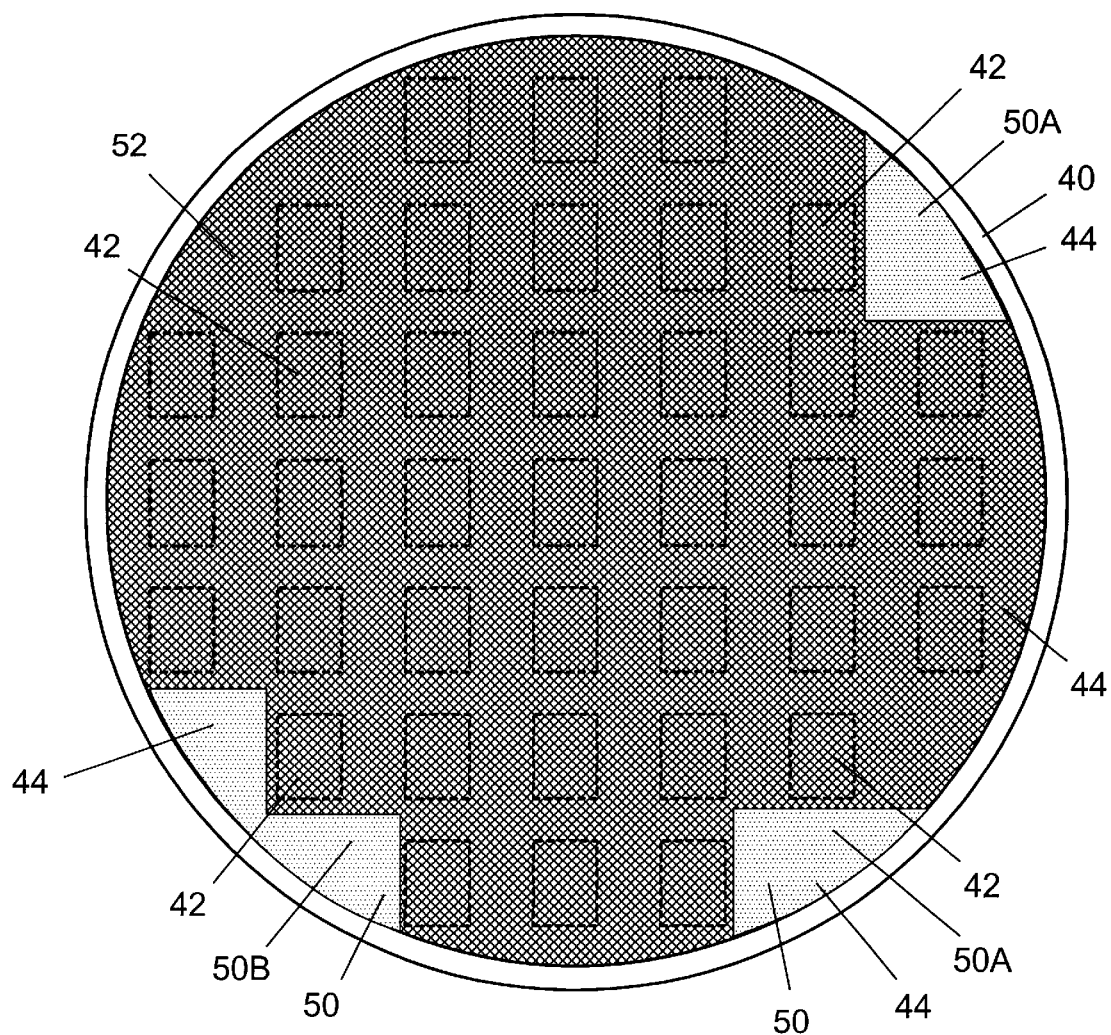
FIG. 5 is a plan view of the wafer of FIG. 3 after a masking layer has been formed above the wafer.

As shown in FIG. 5, the present invention involves the formation of a masking layer 52 above the wafer 40 that leaves portions of the process layer 44 formed above one or more of the non-production areas 50 exposed. In the depicted embodiment in FIG. 5, the masking layer 52 has been formed so as to expose only three of the areas of the process layer 44 that are formed above the non-production areas 50 of the wafer 40. Thereafter, the exposed portions of the process layer 44 above the non-production areas 50 may be subjected to additional processing operations to be described more fully below. In one embodiment, the masking layer 52 is comprised of a layer of photoresist comprised of either positive or negative photoresist material. The masking layer 52 comprised of photoresist may be formed and patterned using known photolithography techniques.

In general, the present invention may be used to identify and selectively process the portions of the process layer 44 formed above the non-production areas 50. For example, in the situation where the process layer 44 is thicker near the edge region 46 of the wafer 40 than at the center region 48 of the wafer 40, the portions of the process layer 44 above the non-production areas 50 may be thinned by performing an etching process, such as a dry plasma etching process. That is, the thickness of exposed portions of the process layer 44 may be reduced in the area above the non-production areas 50. As a result, subsequent compensatory processing steps may be performed for a shorter duration.

Figure 6:
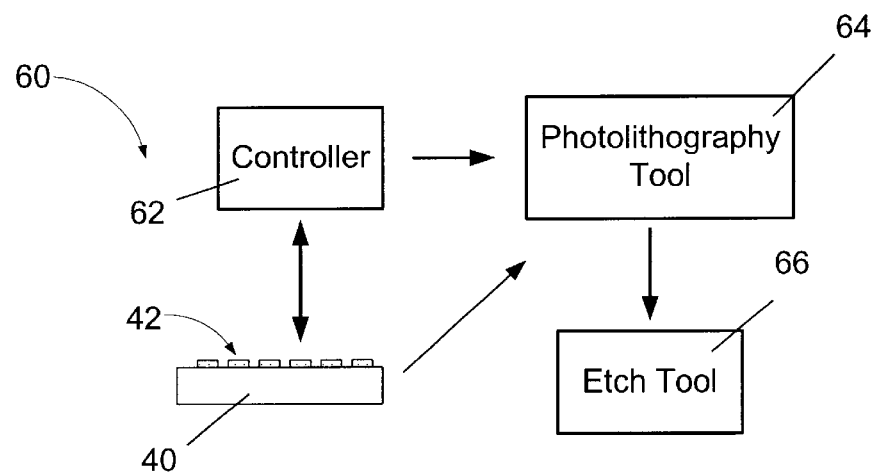
FIG. 6 depicts an illustrative embodiment of a system in accordance with one embodiment of the present invention.

FIG. 6 depicts an illustrative system 60 in accordance with one embodiment of the present invention. The system 60 depicted in FIG. 6 is comprised of a controller 62, a photolithography tool 64, and an etch tool 66. In the illustrated embodiment, the controller 62 is a computer programmed with software to implement the functions described herein. Moreover, the functions described for the controller 62 may be performed by one or more controllers spread through the system. For example, the controller 62 may be a fab level controller that is used to control processing operations throughout all or a portion of a semiconductor manufacturing facility. Alternatively, the controller 62 may be a lower level computer that controls only portions or cells of the manufacturing facility. Moreover, the controller 62 may be a stand-alone device, or it may reside on the photolithography tool 64 or the etch tool 66. However, as will be appreciated by those of ordinary skill in the art, a hard-ware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 62, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E930999—Provisional Specification for CIM Framework Advanced Process Control Component) specifications are publicly available from SEMI.

The photolithography tool 64 is intended to be representative of any of a variety of tools that may be used in forming the masking layer 52. In most modern semiconductor manufacturing facilities, the photolithography tool 64 is a module comprised of a wafer track section and a stepper tool. The photolithography tool 64 may be used in forming the masking layer 52 to any desired shape or configuration. Similarly, the etch tool 66 may be any type of etching tool useful in reducing the thickness of the exposed portions of the process layer 44 above the non-production areas 50. For example, in one embodiment, the etch tool 68 may be a plasma etcher manufactured by Applied Materials. If desired or necessary, a metrology tool (not shown) may be used in identifying across-wafer thickness variations of the process layer 44. For example, such a metrology tool may be an ellipsometer or a profilometer. The metrology tool, if used, may be a stand-alone type tool, or it may be resident on other processing equipment within the plant.

In general, the controller 62 will be programmed with, or assist in identifying, certain non-production areas 50 of the wafer 40. The controller 62 may then determine which, if any, of the portions of the process layer 44 positioned above one or more of the non-production areas 50 are desired to be selectively processed. The wafer 40 may then be provided to the photolithography tool 64 that, based upon information supplied by the controller 62, forms the masking layer 52 so as to expose the desired areas of the process layer 44. Next, the wafer 40 is provided to the etch tool 66 for selective processing, e.g., thinning, of the exposed portions of the process layer 44 above the non-production areas 50 of the wafer 40. Of course, the selective processing of the exposed portions of the process layer 44 may involve processes other than etching.

In general, the present invention is directed to methods of selectively processing wafer edge regions to increase wafer uniformity, and a system for accomplishing same. In one illustrative embodiment, the method comprises providing a wafer comprised of at least one non-production area, forming a process layer above the wafer, forming a masking layer above the process layer, the masking layer being patterned so as to expose a portion of the process layer formed above the at least one non-production area, and performing a process operation on the exposed portion of the process layer formed above the at least one non-production area.

The present invention is also directed to a system for performing the methods described herein. In one embodiment, the system is comprised of a controller for identifying at least one non-production area of a wafer, a photolithography tool for forming a masking layer above the process layer, the masking layer being patterned so as to expose a portion of the process layer formed above at least one non-production area, and an etch tool for performing an etching process on the exposed portion of the process layer formed above the at least one non-production area.

In another embodiment, the system comprises controller means for identifying at least one non-production area of a wafer, means for forming a masking layer above the process layer, the masking layer being patterned so as to expose a portion of the process layer formed above the at least one non-production area, and means for performing an etching process on the exposed portion of the process layer formed above the at least one non-production area. In the disclosed embodiment, the controller means is the controller 62, the means for forming the masking layer 52 is the photolithography tool 64, and the means for performing the etching process is the etch tool 66.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. If is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a wafer comprised of at least one non-production area wherein production die will not be formed;
   forming a process layer above said wafer;
   forming a masking layer above said process layer, said masking layer being patterned so as to expose a portion of said process layer formed above said at least one non-production area; and
   performing a process operation on said exposed portion of said process layer formed above said at least one non-production area.

2. The method of claim 1, wherein providing a wafer comprised of at least one non-production area comprises providing a wafer comprised of a plurality of non-production areas.

3. The method of claim 1, wherein forming a process layer above said wafer comprises depositing a process layer above said wafer.

4. The method of claim 1, wherein forming a process layer above said wafer comprises forming a process layer comprised of at least one of polysilicon, a metal, silicon dioxide, silicon oxynitride and silicon nitride.

5. The method of claim 1, wherein forming a process layer above said wafer comprises forming a process layer above said wafer, said process layer having an across-wafer thickness variation.

6. The method of claim 1, wherein forming a process layer above said wafer comprises forming a process layer above said wafer, said process layer having a generally concave surface profile.

7. The method of claim 1, wherein forming a masking layer comprises forming a masking layer comprised of photoresist.

8. The method of claim 1, wherein performing a process operation on said exposed portion of said process layer formed above said at least one, non-production area comprises performing an etching process operation on said exposed portion of said process layer formed above said at least one non-production area.

9. The method of claim 1, wherein performing a process operation on said exposed portion of said process layer formed above said at least one non-production area comprises performing an etching process operation on said exposed portion of said process layer formed above said at least one non-production area to reduce a thickness of said exposed portion of said process layer.

10. The method of claim 1, further comprising removing said masking layer and performing at least one additional process operation on said process layer.

11. A method, comprising:
    providing a wafer comprised of a plurality of non-production areas wherein production die will not be formed;
    forming a process layer above said wafer;
    forming a masking layer above said process layer, said masking layer being patterned so as to expose portions of said process layer formed above said plurality of non-production areas; and
    performing an etching process operation on said exposed portions of said process layer formed above said plurality of non-production areas.

12. The method of claim 11, wherein forming a process layer above said wafer comprises depositing a process layer above said wafer.

13. The method of claim 11, wherein forming a process layer above said wafer comprises forming a process layer comprised of at least one of polysilicon, a metal, silicon dioxide, silicon oxynitride and silicon nitride.

14. The method of claim 11, wherein forming a process layer above said wafer comprises forming a process layer above said wafer, said process layer having an across-wafer thickness variation.

15. The method of claim 11, wherein forming a process layer above said wafer comprises forming a process layer above said wafer, said process layer having a generally concave surface profile.

16. The method of claim 11, wherein forming a masking layer comprises forming a masking layer comprised of photoresist.

17. The method of claim 11, wherein performing an etching process operation on said exposed portions of said process layer formed above said plurality of non-production areas comprises performing an etching process operation on said exposed portions of said process layer formed above said plurality of non-production areas to reduce a thickness of said exposed portions of said process layer.

18. The method of claim 11, further comprising removing said masking layer and performing at least one additional process operation on said process layer.

19. A method, comprising:

providing a wafer comprised of a plurality of non-production areas wherein production die will not be formed;

forming a process layer above said wafer;

forming a masking layer comprised of photoresist above said process layer, said masking layer being patterned so as to expose portions of said process layer formed above said plurality of non-production areas; and performing an etching process operation on said exposed portions of said process layer formed above said plurality of non-production areas to reduce a thickness of said exposed portions of said process layer.

20. The method of claim 19, wherein forming a process layer above said wafer comprises depositing a process layer above said wafer.

21. The method of claim 19, wherein forming a process layer above said wafer comprises forming a process layer comprised of at least one of polysilicon, a metal, silicon dioxide, silicon oxynitride and silicon nitride.

22. The method of claim 19, wherein forming a process layer above said wafer comprises forming a process layer above said wafer, said process layer having an across-wafer thickness variation.

23. The method of claim 19, wherein forming a process layer above said wafer comprises forming a process layer above said wafer, said process layer having a generally concave surface profile.

24. The method of claim 19, further comprising removing said masking layer and performing at least one additional process operation on said process layer.

* * * * *